United States Patent [19]
Holdermann

[11] Patent Number: 5,543,333
[45] Date of Patent: Aug. 6, 1996

[54] METHOD FOR MANUFACTURING A SOLAR CELL HAVING COMBINED METALLIZATION

[75] Inventor: Konstantin Holdermann, Offingen, Germany

[73] Assignee: Siemens Solar GmbH, Munich, Germany

[21] Appl. No.: 315,430

[22] Filed: Sep. 30, 1994

[30] Foreign Application Priority Data

Sep. 30, 1993 [DE] Germany ............... 43 33 406.7

[51] Int. Cl.⁶ .................................... H01L 31/18
[52] U.S. Cl. .................. 437/4; 437/189; 437/2; 437/203; 156/643.1; 136/256
[58] Field of Search ............. 437/2, 5, 3, 4, 437/189, 190, 203; 136/256, 261; 156/643

[56] References Cited

U.S. PATENT DOCUMENTS

| | | | |
|---|---|---|---|
| 4,171,989 | 10/1979 | Pryor | 136/89 |
| 4,321,283 | 3/1982 | Patel et al. | 427/74 |
| 4,451,969 | 6/1984 | Chaudhuri | 136/256 |
| 4,487,989 | 12/1984 | Wakefield et al. | 136/256 |
| 4,748,130 | 5/1988 | Wenham et al. | 437/2 |
| 5,011,565 | 4/1991 | Dube et al. | 156/643 |
| 5,258,077 | 11/1993 | Shahryar | 437/2 |

FOREIGN PATENT DOCUMENTS

| | | |
|---|---|---|
| 2166178 | 8/1973 | France . |
| 3910353 | 10/1989 | Germany . |
| 4311173 | 10/1993 | Germany . |
| WO93/19492 | 9/1993 | WIPO . |

OTHER PUBLICATIONS

German Patent Application DE P 42 13 903.1 Siemens Solar GmbH, "Halbleiterkörper mit gut haftender Metallisierung", Apr. 8, 1992.

*Primary Examiner*—Tuan H. Nguyen
*Attorney, Agent, or Firm*—Hill, Steadman & Simpson

[57] ABSTRACT

A method for manufacturing high-efficiency solar cells from polycrystalline or monocrystalline semiconductor material is disclosed. Backside contacts are printed on with a metal-containing paste and front side contacts are deposited finely-structured photo-induced. To that end, a nickel layer is deposited photo-induced directly on the semiconductor that is uncovered in openings or trenches within a passivation layer on the front side. The front side contact is reinforced by a further metal layer that is likewise produced by currentless deposition.

12 Claims, 1 Drawing Sheet

METHOD FOR MANUFACTURING A SOLAR CELL HAVING COMBINED METALLIZATION

BACKGROUND OF THE INVENTION

1. Field of the Invention

The present invention is generally directed to solar cells and more specifically to a solar cell having a combined metallization and the manufacturing method for producing same.

2. Description of the Related Art

High-efficiency solar cells of polycrystalline or monocrystalline semiconductor material, for example of silicon, must be optimized toward high efficiency in every detail. For example, wafers are used that have only a light doping and therefore a low hole density. The pn-junction is produced at the front or light incidence side by, for example, drive in of phosphorous, whereby the highly doped zone created in this way has only slight depth.

In order to improve the current conduction at the backside of the solar cell, the p-doping directly under the backside contact is strengthened and reinforced. Aluminum is usually used for this purpose. The aluminum is applied, for example, by vapor-deposition or by being printed onto the backside and being driven in or, respectively, alloyed in.

Various methods and processes are known for the metallization of the solar cells, i.e. for the manufacture of the current-conducting contacts. A structured metallization can be produced in a simple way by printing an electrically-conductive paste on. Arbitrary electrode structures can be produced in a silkscreening process by using a paste containing metal particles.

Metallizations can also be produced by vapor-deposition of a metal layer and can be reinforced in a further step, for example by dip-soldering, voltaic deposition or by currentless chemical deposition. However, it is problematical to produce a metallization by chemical deposition directly onto untreated semiconductor surfaces, for example by nickel deposition from chemically-reductive baths onto a basic base. However, trials for manufacturing larger item numbers exhibited too narrow a process window.

Front side contacts applied with silkscreening can only be realized in structural widths beginning at approximately 80 μm. As a consequence of the high glass component in the paste, contacts that are printed even narrower exhibit a greatly diminished electrical conductivity. Finer structure, however, is required for the front side contact to enhance the performance of the solar cells by reducing the occlusion of active solar cell area caused by the contact.

SUMMARY OF THE INVENTION

It is an object of the present invention to provide an improved solar cell having a finely-structured front side contact for improved efficiency and simple manufacture.

This object is inventively achieved by a method for manufacturing a solar cell having a silicon substrate selected from a group consisting of monocrystalline and polycrystalline silicon. The substrate has a front side and a backside. The method has the steps of: producing a pn-junction in the front side of the silicon substrate, producing a passivation layer on the front side of the silicon substrate, producing a backside contact by printing and sintering an electrically conductive paste on the backside, performing a photo-induced, currentless deposition of a nickel layer as an adhesion layer and diffusion barrier layer directly over an area of the silicon substrate surface that is uncovered in openings within the passivation layer in conformity with a desired metallization structure to form a grid electrode, and performing a currentless reinforcement of the nickel layer with at least one further metal layer selected from a group consisting of silver and copper.

The solar cell of the invention is what is referred to as a hybrid contact solar cell wherein different metallizations are advantageously combined for the front side contact and backside contact. Finer structures can be produced by photo-induced or chemical deposition of metals than can be produced with silkscreening, because of the higher specific conductivity of the pure metal compared to that of a silkscreening paste.

The backside contact of the solar cell of the invention is printed on in a known way. The structural widths of the backside contact play no part since no occlusion can occur here. An additional dopant, for example aluminum, is contained in the printing paste for the backside. This additional dopant alloys into or is driven into the semiconductor of the solar cell when sintering the printed-on backside contact and reinforcing the p-doping therein. A good ohmic contact between semiconductor and backside contact is thus assured. A previous, additional application of dopant on the backside by vapor-deposition, spraying or similar methods and subsequent drive-in to produce a back surface field is possible.

An oxidative or an inert gas atmosphere having little oxygen can be optionally selected for the baking conditions for burning or removing the organic binder or resin of the thick-film paste. A two-stage pre-burning of initially up to approximately 400° C. in an atmosphere containing little oxygen and subsequently burning at a higher temperature in inert gas or in a reducing atmosphere is also possible. It is also possible to use two different metal pastes having frit, for example one for aluminum and one for silver which are successively applied.

The application of a thick-film paste of silver, aluminum and frit without organic binder that only has an easily removable dispersion agent is also possible. The paste can then be applied, for example, by rolling or template printing. The advantage is that the burning can be implemented in a pure inert gas atmosphere or under reducing conditions since an organic binder or resin need not be burned. The metals to be oxidized are thus better available in the following, light-induced metal deposition. Instead of or in addition to the aluminum, other metals such as nickel, palladium, copper, zinc, tin, etc. can be co-burned in the thick-film paste under an inert gas or reducing atmosphere without thereby oxidizing and losing electrical conductivity.

The front or light incidence side of the solar cell can be textured, and a crystal-oriented etching method can be used. The resulting surface has pyramidal elevations or recesses that effect a reduced reflection of incident light and, thus, a higher absorption in the semiconductor.

Further, a passivation or antireflection layer of a dielectric can be applied on the front side. For example, the layer can be silicon oxide $SiO_x$, silicon nitride $Si_3N_4$, titanium oxide $TiO_x$ or a layer combination of these materials. The front side contacts are arranged in openings in the passivation layer in which the semiconductor is uncovered. The openings can be provided in the form of trenches that extend deeply into the semiconductor layer. A selective, photo-induced deposition of metals directly on the semiconductor material uncovered in the openings then occurs without further treatment of the semiconductor surface such as, for example, palladium nucleation. As disclosed in the earlier German patent application P 43 11 173.4, various metals such as, for example, nickel, copper, silver or gold can be deposited photo-induced over pre-treated semiconductor surfaces. The photo-induced, currentless metal deposition is facilitated when electrically conductive structures are already prescribed on the n-doped semiconductor surface. The metal deposition then occurs thereon. A backside metallization is also required. The backside metallization serves as an offering anode and is partly dissolved during the deposition of the metal on the front side. For example, an elementary metal such as nickel, copper, aluminum, silver, gold, etc. or metal-containing pastes are suitable for the offering anode.

The metals can be previously applied on the backside in more or less redundant quantities, so that adequate metal for the later function as backside electrode is still present after the front side metallization. Dependent on the system, of course, it is also possible to protect or, respectively, to reinforce the backside metallization by cathodic (negative) poling during the photo-induced front side metallization. The backside can be subsequently reinforced with other methods as well. A baked-in paste containing silver and aluminum is used as backside metallization and offering anode in the method of the invention.

The front side metallization is constructed of at least two different metals. A nickel layer is deposited first in the openings on the semiconductor because of the better adhesion provided thereby. This thin nickel layer is subsequently reinforced with a further metal that can be deposited over the generated nickel structures chemically reductively or light-induced.

The light-induced nickel deposition can occur from electrolytic nickel baths and chemically-reductive nickel baths onto acidic to basic bases. The deposition can occur at temperatures that lie substantially below the working temperature prescribed for known baths. Given a suitable bath composition, photo-induced, currentless nickel deposition is even possible at room temperature. The reduction agent can have a supporting effect but is not required for the effect.

The photo-induced metal deposition is mainly dependent on the availability of the metal constituent of the backside metallization, i.e. on the possible oxidation and dissolving thereof. In the nickel bath and in the copper bath, this is mainly the aluminum contained in the baked backside metallization. It is therefore advantageous to undertake the aluminum doping in the silver paste higher than usual. In the silver bath, it is both aluminum as well as the silver from the backside metallization.

As a consequence of the increasing contamination of the metal bath caused by the dissolving of the metal, it is important to select a bath having optimally high tolerance to these contaminations, in which these have only little influence of the light-induced deposition behavior, on the bath stability and, thus, on the bath utilization. Another possibility uses a metal in the backside metallization that is not especially critical or not critical at all with respect to the bath contamination. It is also possible to process the contamination out of the bath. In the simplest case, however, a metal contained in the metal deposition bath is selected for this purpose.

Nickel can already be deposited photo-induced even from the sole nickel constituent. It should therefore be possible, for example, to simplify the known chemical metal deposition baths with respect to their composition or to specifically optimize them for photo-induced metal depositions.

As a further metal, silver is preferably deposited over the nickel layer. This can similarly occur photo-induced and currentless from known chemical or electrolytic silver baths. However, a cyanidic silver bath is preferred.

The light-induced deposition of nickel and silver functions in the openings of the dielectric layer even when regions of the semiconductor surface that are not to be metallized are covered with a photoresist or with a transparent galvano-resist. The covering should be so light-transmissive that charge carriers can still be adequately generated photo-induced in the semiconductor. Additional possibilities of intentionally sealing regions on the semiconductor surface that are not to be metallized result.

The metal deposition occurs, for example, with a heated photoresist of the positive or negative type. Adequate transparency is established so that the metal deposition begins within a few seconds even with an incandescent lamp of only 75 watts or with a 150 watt infrared lamp. No stripping whatsoever of the resist occurs in the nickel deposition with a basic chemical nickel bath due to the greatly reduced working temperature. The resist, on the other hand, can be unproblematically subsequently removed in diluted potassium hydroxide solution or with organic solvents. Other baths such as, for example, an alkaline cyanidic silver bath can require a greater curing of the resist. It is also possible to deposit copper from a chemical bath as the further metal over the nickel layer. This deposition can also be promoted by irradiation.

Due to the self-coloring of the aqueous nickel and copper baths, it is advantageous in the light-induced metal deposition to have only a little light-absorbing bath liquid over the surface to be metallized in the irradiation. It is therefore advantageous to use continuous strip methods with an overflow basin (standard in electroplating) for the metal deposition. The wafers or solar cells to be metallized are drawn through just below the liquid surface of the metallization bath with their front side lying up.

The method for manufacturing the solar cell of the invention shall be set forth in greater detail below with reference to the preferred embodiments and the figures. Various method steps are shown with reference to a schematic cross section through a solar cell.

DETAILED DESCRIPTION OF THE PREFERRED EMBODIMENTS

Figure 1A:
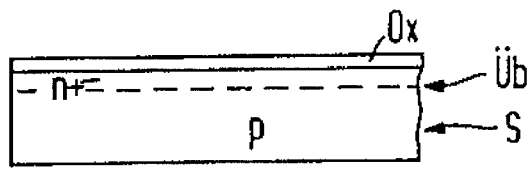
FIG. 1a and 1b illustrate a p-doped wafer of the present invention.
Figure 1B:
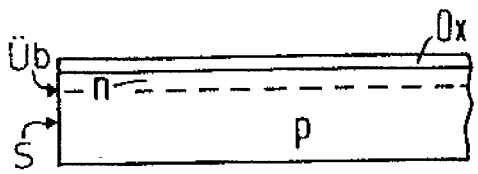

FIG. 1 illustrates a p-doped CZ wafer having <100> orientation selected as an initial material. However, it is also possible to use a corresponding, polycrystalline silicon wafer.

After a potential, short damage etching, a texturing for improving the light incidence geometry is first produced on the surface of the substrate S by basic, crystal-oriented etching. A roughened surface having pyramidal elevations thus arises. However, these are not shown in the figures. A shallow $n^+$-doped zone and, thus, a shallow pn-junction Ub are generated on the front side of the future solar cell, for example by drive-in of phosphorous. For passivation of the front side, an oxide layer Ox is, for example, generated thereover. This oxide layer simultaneously serves as an antireflection layer in the future solar cell. A silicon nitride layer or a layer combined of both materials can serve the same purpose. It is also possible to generate a titanium oxide layer over the oxide layer as the antireflection layer.

Figure 2A:
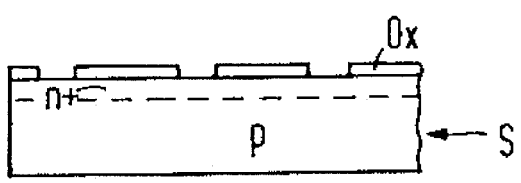
FIG. 2a illustrates an embodiment of the present invention having openings in a oxide layer.

For defining the front side contact, openings are now produced in the oxide or nitride layer Ox. The openings can be embodied as slots (see FIG. 2a). The openings can also be embodied to potentially extend into the silicon in the form of trenches Gr (see FIG. 2b).

The definition and shape of the openings, which correspond to the structure of the desired front side metallization, can, for example, occur by photolithography and subsequent oxide etching. After this, continued work can be carried out either in planar technology (FIGS. 1a–4a) or in trench technology (FIGS. 1b–4b).

Figure 2B:
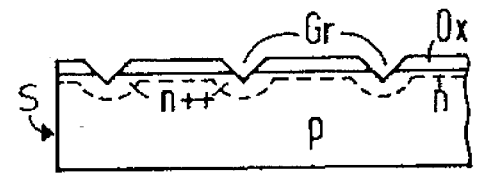
FIG. 2b illustrates an embodiment of the present invention having trenches.

For example, in FIG. 2b a direct production of the trenches Gr occurs by laser writing or by mechanical erosion, for example with the use of a diamond-tipped tool. For photolithograpic definition, a positive photoresist is preferably used that, after being exposed and developed, represents the etching mask for the wet-chemical oxide or, respectively, nitride opening that, for example, is implemented in a solution containing nitric acid.

The production of trenches Gr in silicon occurs in a basic solution with the remaining oxide or, respectively, nitride as etching mask. Planar technique (see FIGS. 1a–4a) is preferred for especially thin wafers (substrate S) because of the breakage risk.

In an exemplary embodiment, trenches Gr having a width of approximately 20–50 μm are generated at a distance of approximately 1 mm from one another. Subsequently, the n-doping in the trenches Gr is reinforced with a renewed phosphorous diffusion to form $n^{++}$-doped regions (see FIG. 2b).

In the case of an all around diffusion, the pn-junction should be separated no later than before the backside contacting. The pn-junction can be separated, for example, by plamsa etching, sawing or by using a laser treatment of the edge.

Figure 3A:
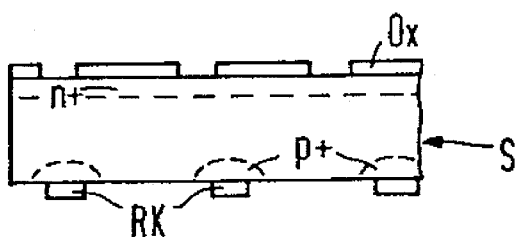
FIG. 3a illustrates a backside contact produced on an embodiment of the present invention.
Figure 3B:
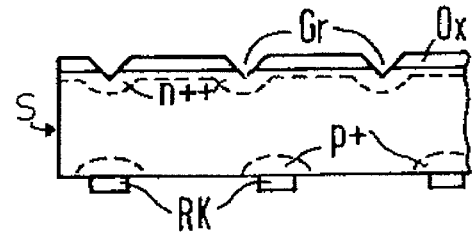
FIG. 3b illustrates a backside contact produced on another embodiment of the present invention.

In the next method step illustrated for the two embodiments in FIGS. 3a and 3b respectively, the backside contact is produced by printing on the conductive paste that, for example, contains silver by silkscreening, for example. Other suitable application methods are template or tampon printing, paste writing, rolling or similar methods. The back contact is applied surface-wide or structured. When baking or sintering the printed structures, the dopant additionally contained in the paste is partially driven into the substrate S and generates $p^+$-doped zones on the backside that assure a good ohmic contact between substrate S and the backside contact RK.

Subsequently, the front side contact is produced by metallization of the semiconductor surface exposed in the trenches or, respectively, openings. To that end, a nickel layer is first deposited photo-induced and currentless on the uncovered $n^+$- or $n^{++}$-doped semiconductor surfaces.

A nickel sulfamate bath usually used for electroplating serves, for example, as a metallization bath. However, it is also possible to use other nickel baths, for example baths for chemical nickel deposition that can be set from acidic through basic. The reduction agent present in the chemical deposition baths is thereby not required fundamentally, but can promote the deposition.

Immediately before the nickel deposition, the substrates are freed of the thin oxide film both in the planar as well as in the trench technique by a short immersion into or, respectively, short treatment with a solution containing nitric acid. The thin oxide film is formed on the semiconductor surface uncovered in the openings, slots or, respectively, trenches Gr during the baking process of the backside contacts RK. For the nickel deposition itself, the substrates are irradiated with a suitable radiation source, for example a 75 watt incandescent lamp or a 150 watt infrared lamp at approximately 50°–60° C. in a slightly alkaline chemical deposition bath. The substrates are irradiated therein with their front side facing up. The nickel deposition on the semiconductor surface already begins after a two seconds. A well-adhering, adequately thick nickel layer NS is generated after approximately 1–2 minutes. A further metal layer VS is capable of being directly generated over this nickel layer NS for reinforcement. A nickel layer having a thickness of 0.2–2 μm is obtained after a deposition time of 1–3 minutes.

As the further metal layer VS, a copper layer that is approximately 5–20 μm thick is now produced thereover, for example by chemical deposition from a corresponding, commercially obtainable copper deposition bath or, analogous to the production of the nickel layer NS, photo-induced in currentless fashion from an arbitrary copper-containing bath, for example from a copper sulfate solution. Due to the oxidation sensitivity of the nickel layer NS, the reinforcing copper layer VS is preferably deposited immediately after the production of the nickel layer. The copper layer can in turn be protected against oxidation by applying another thin layer, for example a thin coating of silver or tin.

The further reinforced layer VS, however, is preferably produced by light-induced deposition of a silver layer that is approximately 4–10 μm thick. A silver salt solution of $KAg(CN)_2$ hitherto suitable only for electrolytic silver deposition can be used for this purpose. The implementation of the photo-induced deposition occurs at room temperature. As a result of the clear silver salt solution, the silver deposition can also be implemented in a tray mode, whereby a plurality of substrates S are successively placed into the metallization bath at a slight distance from one another and, for example, are obliquely illuminated from above. Given illumination with a 75 watt incandescent lamp from a distance of approximately 30 cm, the silver layer VS can be deposited to said thickness within 1–3 minutes at room temperature.

Figure 4A:
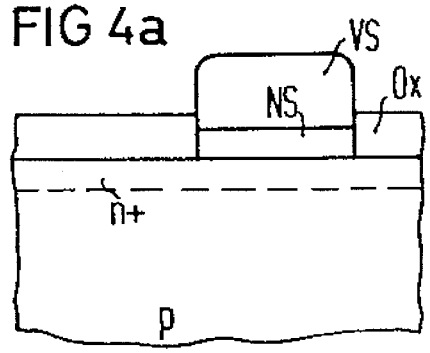
FIG. 4a illustrates an embodiment of the present invention having a complete front side metallization deposited in a slot opening.
Figure 4B:
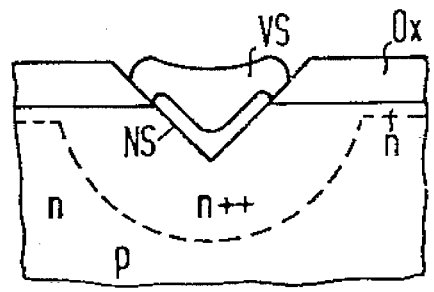
FIG. 4b illustrates an embodiment of the present invention having a complete front side v-shaped cross section metallization in a trench opening.

FIG. 4a shows portions of an oxide opening embodiment with a slot having what is now a complete front side metallization deposited therein. The trench shown in FIG. 4b has a V-shaped cross section, but can also be produced with a flat floor, i.e. with a trapezoidal or rectangular cross section. In this case, the trench floor can be provided with a further texturing whose production is proposed, for example, in German patent application P 42 13 903.1. The depth of the trench here is approximately 15 μm but can also be implemented shallower or deeper. A front side metallization (NS, VS) having the recited layer thicknesses is generated in the trenches. The surface of the front side metallization does not project beyond the level of the oxide layer Ox. Such a metallization exhibits good adhesion even under strong mechanical stressing and is therefore well-protected against being torn off or against other damage. It is also possible, however, to implement thicker front side contacts, so that they are raised above the remaining surface of the oxide layer, as shown, for example, in the embodiment with a slot opening illustrated in FIG. 4a.

The manufacture of finely structured front side contacts having structural widths down to 20 μm is significantly improved and simplified with the method of the invention. Although a photo-induced, currentless deposition of silver or nickel over highly conductive structures over a silicon surface is already disclosed in the earlier German application P 43 11 173.4, a conductive structure in the form of, for example, a palladium nucleation layer is first produced therein. This requires a further, palladium-containing metallization bath that contains nitric acid and that can attack the printed backside contacts. Moreover, the palladium nucleation layer cannot be deposited on the front side 100% selectively given high piece numbers (in the tray mode), so that the following metallization baths for backside depositions can even lead to the paste metallization therein. Further, inhomogeneities are observed, particularly at the junction between the palladium nucleation layer and the dielectric. These inhomogeneities also result in a continued, inhomogeneous metal deposition over the nucleation layer. Particularly given fine metallization structures, this can lead to undesired intergrowths or can even lead to a faulty front side metallization.

The inherently known trench technique also has the advantage that the metallizations produced in the trenches have a larger contact area to the semiconductor than do corresponding, planarly applied contacts having the same base area. Given the same performance capability of the contacts, narrower metallization webs or tracks can therefore be produced in the trench technique. These lead to less occlusion of the solar cell surface. The inventors have manufactured the solar cells in the exemplary embodiments to achieve efficiencies of nearly 17%.

Although other modifications and changes may be suggested by those skilled in the art, it is the intention of the inventor to embody within the patent warranted hereon all changes and modifications as reasonably and properly come within the scope of his contribution to the art.

I claim:

1. Method for manufacturing a solar cell having a silicon substrate selected from a group consisting of monocrystalline and polycrystalline silicon, said substrate having a front side and a backside, said method comprising the steps of:

forming a pn-junction in said front side of said silicon substrate;

forming a passivation layer on said front side of said silicon substrate;

forming a backside contact by printing and sintering an electrically conductive paste on said backside in an inert gas atmosphere;

performing a photo-induced, currentless deposition of a nickel layer as an adhesion layer and diffusion barrier layer directly over an area of said silicon substrate surface that is uncovered in openings within said passivation layer in conformity with a desired metallization structure to form a grid electrode wherein said openings in said passivation layer are photolithographically defined and produced by wet chemical etching; and performing photo-induced, a currentless reinforcement of said nickel layer with at least one further metal layer selected from a group consisting of silver and copper, wherein the backside contact serves as a sacrificial anode and enters partially into solution during the metal deposition on the front side.

2. Method according to claim 1, wherein said step of producing a backside contact by printing and sintering an electrically conductive paste on said backside is further performed by using a paste containing silver and a further dopant for forming a doping region under said backside contact.

3. Method according to claim 1, wherein said step of performing a currentless reinforcement of said nickel layer with at least one further metal layer selected from a group consisting of silver and copper is further defined by performing a photo-induced deposition of said silver.

4. Method according to claim 1, which said step of performing a currentless reinforcement of said nickel layer with at least one further metal layer selected from a group consisting of silver and copper is further defined by performing a photo-induced deposition of said copper.

5. Method according to claim 1, which said step of performing a currentless reinforcement of said nickel layer with at least one further metal layer selected from a group consisting of silver and copper is further defined by chemically depositing said copper.

6. Method for manufacturing a solar cell having a silicon substrate selected from a group consisting of monocrystalline and polycrystalline silicon, said substrate having a front side and a backside, said method comprising the steps of:

forming a pn-junction in said front side of said silicon substrate;

forming a passivation layer on said front side of said silicon substrate;

forming a backside contact by printing and sintering an electrically conductive paste on said backside in an inert gas atmosphere;

performing a photo-induced, currentless deposition of a nickel layer as an adhesion layer and diffusion barrier layer directly over an area of said silicon substrate surface that is uncovered in slots within said passivation layer in conformity with a desired metallization structure to form a grid electrode, wherein said slots within said passivation layer are photolithographically defined and produced by wet-chemical etching; and performing a photo-induced, currentless reinforcement of said nickel layer with at least one further metal layer selected from a group consisting of silver and copper, wherein the backside contact serves as a sacrificial anode and enters partially into solution during the metal deposition on the front side.

7. Method avoiding to claim 6, wherein said step of performing a currentless reinforcement of said nickel layer with at least one further metal layer selected from a group consisting of silver and copper is further defined by performing a photo-induced deposition of said silver.

8. Method avoiding to claim 6, wherein said step of performing a currentless reinforcement of said nickel layer with at least one further metal layer selected from a group consisting of silver and copper is further defined by chemically depositing said copper.

9. Method for manufacturing a solar cell having a silicon substrate selected from a group consisting of monocrystalline and polycrystalline silicon, said substrate having a front side and a backside, said method comprising the steps of:

forming a pn-junction in said front side of said silicon substrate;

forming a passivation layer on said front side of said silicon substrate;

forming a backside contact by printing and sintering an electrically conductive paste on said backside in an inert gas atmosphere;

performing a photo-induced, currentless deposition of a nickel layer as an adhesion layer and diffusion barrier layer directly over an area of said silicon substrate surface that is uncovered in trenches within said passivation layer in conformity with a desired metallization structure to form a grid electrode, wherein said trenches within said passivation layer are photolithographically defined and produced by wet-chemical etching; and performing a photo-induced, currentless reinforcement of said nickel layer with at least one further metal layer selected from a group consisting of silver and copper, wherein the backside contact serves as a sacrificial anode enters partially into solution during the metal deposition on the front side.

10. Method avoiding to claim 9, wherein said step of performing a currentless reinforcement of said nickel layer with at least one further metal layer selected from a group consisting of silver and copper is further defined by performing a photo-induced deposition of said silver and chemically depositing said copper.

11. Method according to claim 9, wherein said step of performing a currentless reinforcement of said nickel layer with at least one further metal layer selected from a group consisting of silver and copper is further defined by performing a photo-induced deposition of said silver.

12. Method according to claim 9, wherein said step of performing a currentless reinforcement of said nickel layer with at least one further metal layer selected from a group consisting of silver and copper is further defined by chemically depositing said copper.

* * * * *